(12) United States Patent
Nachumovsky

(10) Patent No.: US 6,871,307 B2
(45) Date of Patent: Mar. 22, 2005

(54) EFFICIENT TEST STRUCTURE FOR NON-VOLATILE MEMORY AND OTHER SEMICONDUCTOR INTEGRATED CIRCUITS

(75) Inventor: Ishai Nachumovsky, Zichron Yaakov (IL)

(73) Assignee: Tower SemiconductorLtd., Migdal Haemek (IL)

( * ) Notice: Subject to any disclaimer, the term of this patent is extended or adjusted under 35 U.S.C. 154(b) by 397 days.

(21) Appl. No.: 09/975,064

(22) Filed: Oct. 10, 2001

(65) Prior Publication Data

US 2003/0074611 A1 Apr. 17, 2003

(51) Int. Cl.$^7$ .......................... G11C 29/00; G01R 27/08
(52) U.S. Cl. ....................... 714/718; 324/765
(58) Field of Search .................. 714/718, 721, 714/724, 733, 734, 735, 738, 739, 742; 365/176, 180, 208; 324/763, 765, 690, 72.5, 727

(56) References Cited

U.S. PATENT DOCUMENTS

| | | | | |
|---|---|---|---|---|
| 6,127,837 A | * | 10/2000 | Yamamoto et al. | 324/765 |
| 6,133,744 A | * | 10/2000 | Yojima et al. | 324/754 |
| 6,380,755 B1 | * | 4/2002 | Sato | 324/765 |
| 6,525,555 B1 | * | 2/2003 | Khandros et al. | 324/765 |

* cited by examiner

Primary Examiner—Christine T. Tu
(74) Attorney, Agent, or Firm—Bever, Hoffman & Harms, LLP; E. Eric Hoffman

(57) ABSTRACT

A test system includes a test wafer having non-volatile memory dies and an exposed set of pads. A probe wafer includes test circuitry, a first set of pads exposed at a first surface, a second set of pads exposed at a second surface (opposite the first surface), and an interconnect structure. The interconnect structure includes traces that extend through the probe card or around the edges of the probe card, between the first and second surfaces. A prober aligns the test wafer with the probe wafer, such that the pads of the test wafer contact the first set of pads of the probe wafer. The prober further contacts the second set of pads of the probe wafer, and provides connections between these pads and a tester. The probe wafer is fabricated using semiconductor processing techniques, so that precise alignment exists between the test wafer and the probe wafer.

43 Claims, 2 Drawing Sheets

EFFICIENT TEST STRUCTURE FOR NON-VOLATILE MEMORY AND OTHER SEMICONDUCTOR INTEGRATED CIRCUITS

FIELD OF THE INVENTION

The present invention relates to a method and apparatus for testing non-volatile memory (NVM) and other semiconductor integrated circuits. More specifically, the present invention relates a method and apparatus for testing bare wafers (wafer probe operation) and wafers that have been packaged at the wafer level, but not yet been subjected to the sawing operation (i.e., chip scale packaged wafers).

BACKGROUND OF THE INVENTION

In conventional wafer probe operation, it is desirable to simultaneously test a large portion of the dies fabricated on a wafer. Today's technology attempts to maximize the number of dies on the wafer that can be tested in parallel. Using conventional methods, 16 to 32 dies on the same wafer can be tested in parallel (with each die having about 48–60 test pins). Parallel testing is particularly useful when testing dies that have long test cycles. For example, it is desirable to test a large number of non-volatile memory devices in parallel, because the test cycle for these devices is extremely long due to multiple program and erase operations performed during testing.

Methods for increasing the number of dies tested in parallel need to address the following two issues. The probing device must be able to make contact to all of the circuits being tested in parallel. In addition, the tester must be able to process information received from the signal pins of the probing device.

It would therefore be desirable to have improved methods and structures for testing a large number of dies on a wafer in parallel.

SUMMARY

Accordingly, the present invention provides an improved system for testing a plurality of dies on a wafer (hereinafter referred to as a "test wafer") in parallel. The test wafer can be a bare wafer or a wafer level chip scale packaged (WLCSP) wafer. Each of the dies includes a non-volatile memory array, which must be tested. A first set of pads, having a first pattern, is exposed at an upper surface of the test wafer. These pads are used to provide electrical connections to the dies.

A probe wafer is used to provide connections to the first set of pads on the test wafer, as well as to ease the burden of a tester coupled to the test wafer. The probe wafer is a semiconductor wafer that includes an auxiliary test circuit fabricated thereon, a second set of pads exposed in a second pattern at a first surface of the probe wafer, and a third set of pads exposed in a third pattern at a second surface of the probe wafer. The probe wafer further includes an interconnect structure, which couples the auxiliary test circuit, the second set of pads and the third set of pads.

A prober is used to align the test wafer with the probe wafer, and then place these wafers into contact with one another. The prober can use optical and/or mechanical alignment techniques to align the test wafer with the probe wafer. The prober positions the test wafer and the probe wafer such that the upper surface of the test wafer faces the first surface of the probe wafer. When the test wafer and the probe wafer are placed into contact, the first set of pads on the test wafer are placed into electrical contact with the second set of pads on the probe wafer. The first and second patterns are selected such that this is possible with proper alignment between the test wafer and the probe wafer. In a particular embodiment, electrically conductive studs or balls are located on the second set of pads, thereby facilitating proper contact between the first and second sets of pads. In this manner, the probe wafer is advantageously able to contact all of the dies on the test wafer simultaneously.

The interconnect structure of the probe wafer includes a plurality of traces that extend between the first and second opposing surfaces of the probe wafer. For example, some traces may extend around the outer edges of the probe wafer, thereby coupling the second set of pads on the first surface of the probe wafer to the third set of pads on the second surface of the probe wafer. Moreover, some traces may extend completely through probe wafer, thereby coupling the second set of pads on the first surface of the probe wafer to the third set of pads on the second surface of the probe wafer.

The prober further includes a plurality of probe needles, which contact the third set of pads on the second surface of the probe wafer. These probe needles are coupled to a tester.

The auxiliary test circuitry located on the probe wafer greatly reduces the required signal path between the tester and the probe wafer. For example, the tester may send an instruction, such as program, erase or read/verify, to the probe card. In response, the auxiliary test circuitry on the probe card can initiate and control the corresponding operations on the test wafer. In one embodiment, the auxiliary test circuitry enables all of the dies on test wafer to be tested in parallel. The results of the test are transmitted from the auxiliary test circuitry on the probe wafer to the tester.

In one variation, the test wafer can include built-in self-test circuits, thereby reducing the required signal path between the probe wafer and the test wafer. The (BIST) circuits can be located on the dies, in the scribe-line areas of the test wafer, or in drop-in areas of the test wafer.

The present invention will be more fully understood in view of the following description and drawings.

DETAILED DESCRIPTION

In general, the present invention relates to the testing of non-volatile memory circuits located on a semiconductor wafer, before the wafer is sawn into a plurality of dies. The testing can be performed on a bare wafer, or on a wafer that has been subject to wafer level chip scale packaging (WLCSP). Both bare wafers and WLCSP wafers will have exposed contact pads that must be contacted to perform testing of the non-volatile memory circuits located on the wafers. The contact pads of WLCSP wafers will have a significantly larger size, spacing and pitch than the contact pads of the corresponding bare wafers. As a result, it is easier to contact the pads of the WLCSP wafers than the pads of the bare wafers. However, the present invention is applicable to both bare wafers and WLCSP wafers. Table 1 shows a comparison of typical size, spacing and pitch for contact pads on both a bare wafer and the corresponding WLCSP wafer.

TABLE 1

|  | Bare Wafer | WLCSP Wafer |
| --- | --- | --- |
| Pad size | 80–100 um | 200–300 um |
| Pad spacing | 20–30 um | 100–200 um |
| Pad pitch | 100–130 um | 300–500 um |

Figure 1:
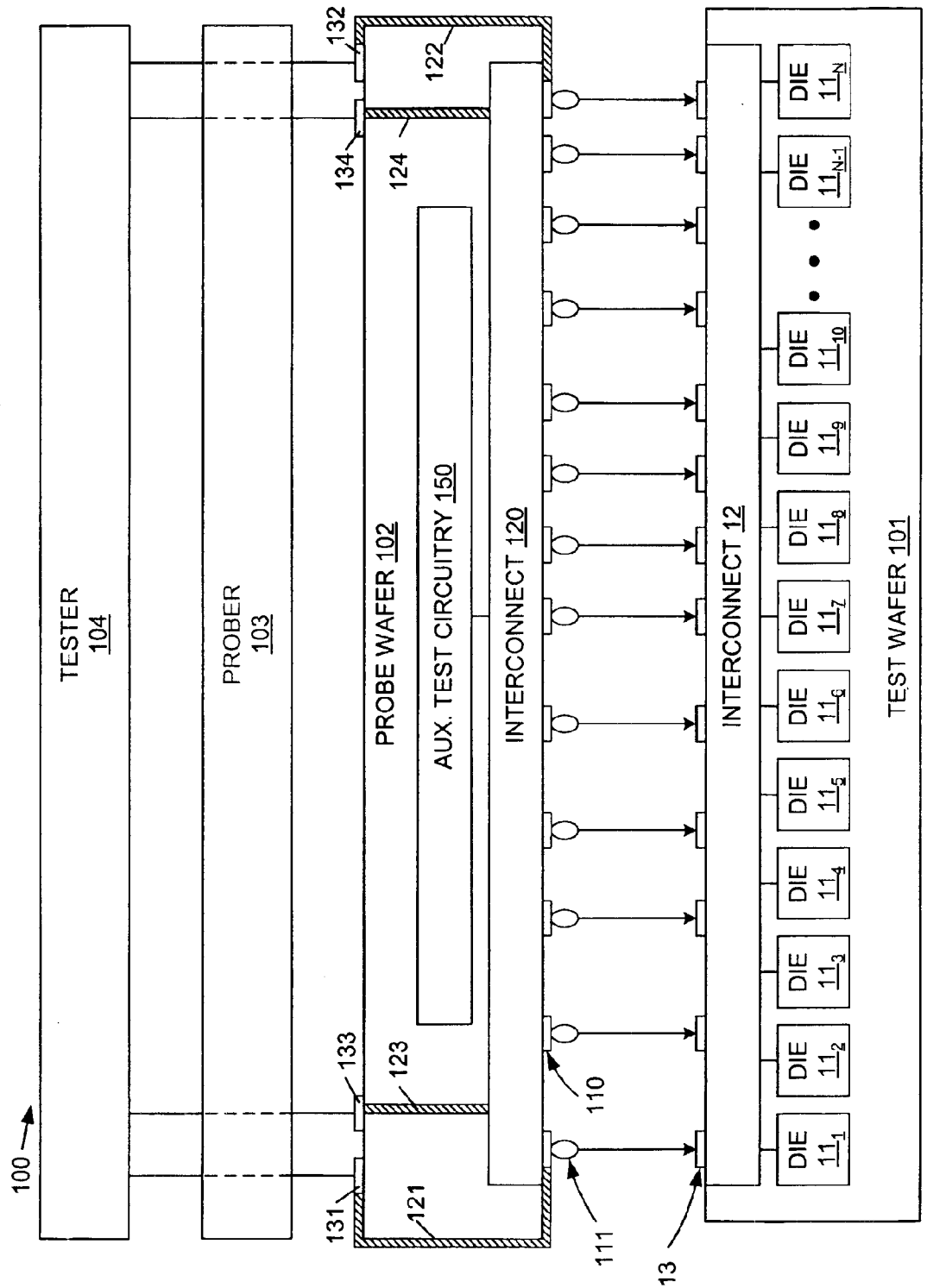
FIG. 1 is a block diagram of a test system including a test wafer, a probe wafer, a prober and a tester in accordance with one embodiment of the present invention.

FIG. 1 is a block diagram of a test system 100 in accordance with one embodiment of the present invention. Test system 100 includes test wafer 101, probe wafer 102, prober 103 and tester 104. Test wafer 101 is a conventional wafer that includes circuitry to be tested. Test wafer 101 can be a bare wafer or a WLCSP wafer having pad characteristics described above. When test wafer 101 has been subjected to wafer level chip scale packaging (WLCSP), there is a better opportunity for probe wafer 102 to be placed into full contact with test wafer 101. Test wafer 100 includes a plurality of dies $11_1$–$11_N$, a multi-layer interconnect structure 12 and a plurality of pads 13. In the described embodiment, test wafer 101 is a WLCSP wafer having about 600 dies, each die including non-volatile memory that must be tested. Pads 13 are exposed at the upper surface of test wafer 101, thereby providing access to the circuits to be tested. It is understood that test wafer 101 has many more pads than illustrated, and that the illustrated pads are not to scale.

Probe wafer 102 is provided for probing dies $11_1$–$11_N$ on test wafer 101 in parallel. In the described embodiment, probe wafer 102 is fabricated from a silicon wafer, relying largely on conventional semiconductor processes. Bonding pads 110 are fabricated on probe wafer 102 in a pattern that matches the pattern of pads 13 on test wafer 101. Electrically conductive studs 111, which perform the function of probe card needles, are fabricated on bonding pads 110 of probe wafer 102. Studs 111 are used to temporarily connect pads 110 to pads 13, such that testing can be performed. In one embodiment, studs 111 are fabricated using a conventional process, which may include (but is not limited to) a process used to fabricate solder balls. In one embodiment, studs 111 are made of a material that is more durable than conventional solder balls.

The resulting studs 111 are sturdy and flexible and create minimal damage to the pads 13 of test wafer 101. As a result, studs 111 do not compromise the ability of pads 13 to be used for subsequent wire bonding or for assembly to a printed circuit board.

Probe wafer 102 further includes a multi-layer interconnect structure 120 that couples pads 110 to auxiliary test circuit 150. Auxiliary test circuit 150 is fabricated on the silicon substrate of probe wafer 102. Because probe wafer 102 is fabricated using semiconductor process technology, an entire integrated circuit can be designed and fabricated on probe wafer 102. This enables auxiliary test circuit 150 to implement many testing routines, thereby easing the requirements of tester 104. In one embodiment, auxiliary test circuit 150 includes a plurality of built-in self-test (BIST) circuits. For example, one BIST circuit can be provided for each of dies $11_1$–$11_N$.

Probe wafer 102 further includes a plurality of traces that extend between pads 110 on the lower surface of probe wafer 102 and pads on the upper surface of probe wafer 102. For example, traces 121 and 122 extend over the sides of probe wafer 102, thereby providing connections to pads 131 and 132, respectively, on the upper surface of probe wafer 102. In another example, traces 123 and 124 extend through holes in probe wafer 102, thereby providing connections to pads 133 and 134, respectively. Traces 123–124 and pads 133–134 may be fabricated using MEMs processing technology.

Traces 121–124 can provide connections to pads 110 or to auxiliary test circuit 150. As a result, signals can be routed between auxiliary test circuit 150 and pads on the upper surface of probe wafer 102, such as pads 131–134. In addition, signals can be routed between pads 110 to pads on the upper surface of probe wafer 102, such as pads 131–134, thereby bypassing auxiliary test circuit 150. In one embodiment, auxiliary test circuit 150 includes a plurality of switches, which are controlled to either connect auxiliary test circuit 150 to a test signal path between test wafer 101 and tester 104, or to disconnect (i.e., bypass) auxiliary test circuit 150 from a test signal path between test wafer 101 and tester 104. In yet another embodiment, auxiliary test circuit 150 is eliminated, such that probe wafer 102 simply operates to couple test wafer 101 and tester 104.

Prober 103 is used to align pads 110 (and studs 111) of probe wafer 102 with the pads 13 of test wafer 101. Prober 103 is also used to contact the pads located on the backside of probe wafer 102 (e.g., pads 131–134), and provide connections to tester 104.

Prober 103 aligns probe wafer 102 with test wafer 101 in the following manner. First, probe wafer 102 is aligned with prober 103. Prober 103 is a machine that is typically used to align a probe card with a test wafer, and then hold these two elements together. Prober 103 can be obtained from companies such as Electroglas, Inc. or TSK, Inc.

Figure 2:
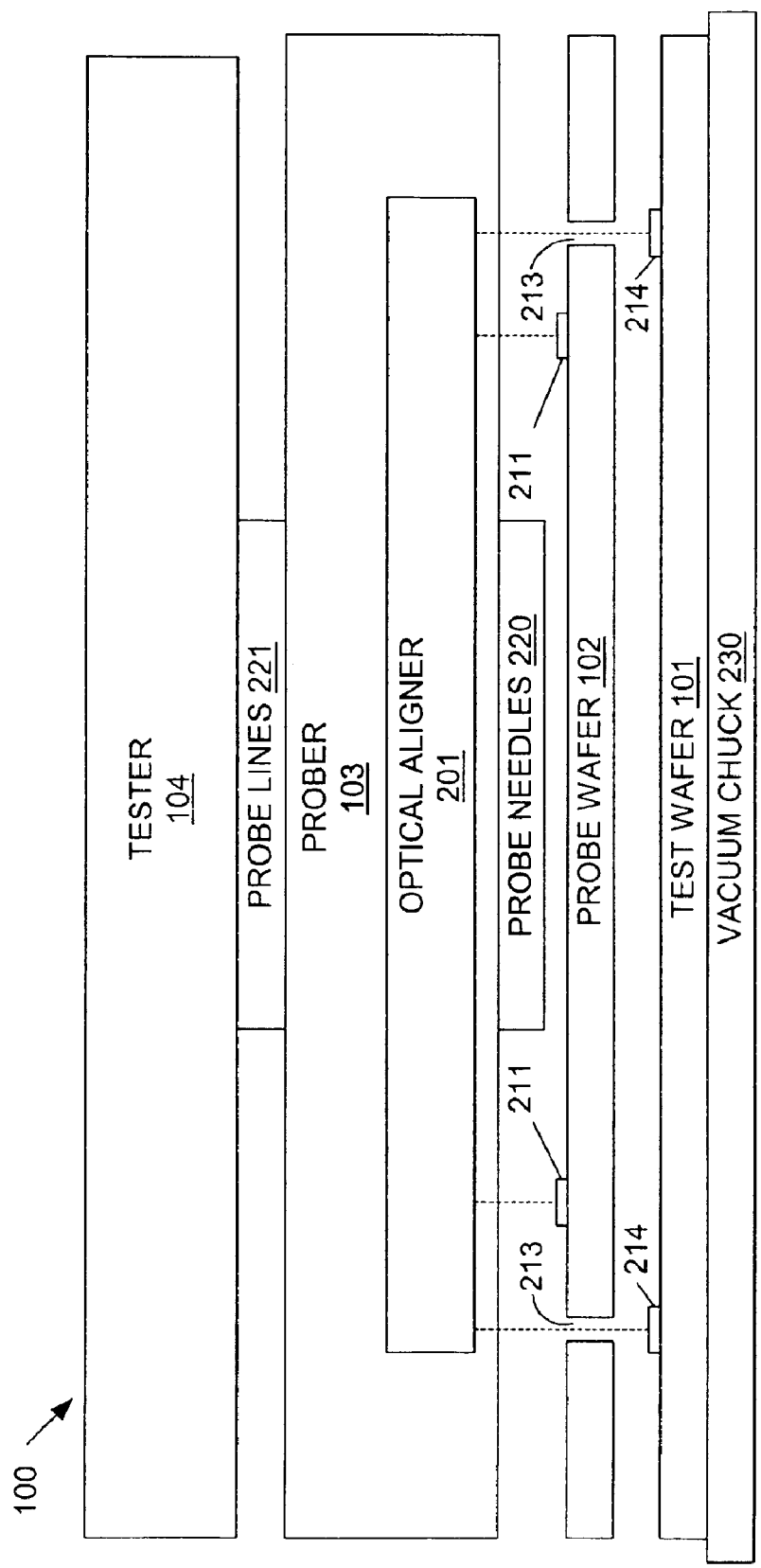
FIG. 2 is another block diagram of the test system of FIG. 1, which illustrates various methods for using the prober to align the probe wafer and the test wafer.

FIG. 2 is another block diagram of test system 100, which illustrates other features of this system. More specifically, FIG. 2 illustrates various methods of aligning probe wafer 102 and test wafer 101. In one embodiment, alignment marks 211 are placed on probe wafer 102, and prober 103 is aligned with these alignment marks 211 using an optical alignment system 201 present in prober 103. After this alignment is performed, prober 103 is affixed to probe wafer 102, such that probe needles 220 are placed into proper contact with corresponding pads on the backside of probe wafer 102.

In one embodiment, probe wafer 102 also includes a plurality of alignment openings 213 that are formed by "digging" holes through probe wafer 102. The digging operations are performed using conventional silicon micro-machining processes that are consistent with conventional MEMs processing schemes and equipment.

Test wafer 101 is held stationary on a vacuum chuck 230. Prober 103 aligns test wafer 101 with probe wafer 102. To accomplish this alignment, alignment marks 214 are placed on test wafer 101 during the fabrication of this test wafer 101. The alignment marks 214 on test wafer 101 are selected to correspond with the alignment holes 213 on probe wafer 102. Optical alignment system 201, which is located in prober 103, aligns the alignment holes on probe wafer 102 with the alignment marks on test wafer 101. After the alignment is completed, prober 103 holds probe wafer 102 on test wafer 101, such that pads 13 of test wafer 101 contact studs 111 of probe wafer 102 in the desired manner.

In one variation, test wafer 101 and probe wafer 102 have exactly the same shape, such that these wafers can be roughly aligned by mechanically aligning the shapes of these wafers. This mechanical alignment provides an acceptable starting condition for the optical alignment system 201, which completes the alignment task in the manner described above.

In the above-described embodiments, excellent alignment will exist between test wafer 101 and probe wafer 102 because both test wafer 101 and probe wafer 102 are fabricated using established semiconductor processing techniques. When test wafer 101 has been subjected to wafer level chip scale packaging (WLCSP), there is a better opportunity for probe wafer 102 to be placed into full contact with test wafer 101, based on the size, spacing and pitch of the pads.

In another embodiment, probe wafer 102 is not made of silicon, but of glass or another material. In this embodiment, the alignment of probe wafer 102 to test wafer 101 will be simpler because of the optically transparent nature of probe wafer 102. However, it is more difficult to fabricate an electronic circuit, such as auxiliary test circuit 150, on a glass wafer than a silicon wafer.

As described above, prober 103 includes probe needles 220 that contact the pads (e.g., pads 131–134) located on the backside of probe wafer 102. Auxiliary test circuit 150 reduces the number of pads required on the backside of probe wafer 102. As a result, probe needles 220 are easily able to make contact to the pads on the backside of probe wafer 102. Probe lines 221 provide electrical connections between probe needles 220 and tester 104 in a manner well known to those of ordinary skill in the art.

After the probe wafer 102 has been aligned and connected to test wafer 101 and tester 104, various tests can be performed on test wafer 101. Some exemplary tests are listed below.

Contact Test

In one embodiment, auxiliary test circuit 150 includes contact test circuitry for identifying proper electrical connections between pads 110 of probe wafer 102 and pads 13 of test wafer 101. This circuitry is built on probe wafer 102 using conventional semiconductor processing methods. This circuitry tests for electrical connections as probe wafer 102 is lowered onto test wafer 101. In one embodiment, this contact test circuitry includes a bridge circuit. The contact test circuitry is used to determine whether the test wafer 101 is properly connected to probe wafer 102, such that other tests can be performed. Advantageously, the contact test circuitry enables a large number of contact conditions to be identified in parallel.

Program and Erase

As described above, each of dies $11_1$–$11_N$ includes a non-volatile memory device that must be tested. In the described embodiment, each of these non-volatile memory devices has a capacity of 16 Mbits, and is configured to store 16-bit words. To program the non-volatile memory devices in dies $11_1$–$11_N$, tester 104 issues a program command to auxiliary test circuit 150. In response, auxiliary test circuit 150 performs a program operation, wherein a test pattern is written to each of the non-volatile memory devices in parallel. In this embodiment, auxiliary test circuit 150 includes a plurality of built-in self-test (BIST) circuits, such that each of dies $11_1 11_N$ has a corresponding BIST circuit in auxiliary test circuit 150. In the described embodiment, the time required to program each 16-bit word is about 10 $\mu$sec. Consequently, the time required to program an entire 16 Mbit device is about 10 seconds (including an internal verify operation). Because all of dies $11_1 11_N$ are programmed in parallel, the time required to program all of the non-volatile memory devices on test wafer 101 is about 10 seconds. Advantageously, there is a relatively small signal channel requirement between tester 104 and probe wafer 102 for a program operation. Probe wafer 102 advantageously provides a relatively high signal channel requirement between auxiliary test circuit 150 and dies $11_1$–$11_N$.

To erase the non-volatile memory devices in dies $11_1$–$11_N$, tester 104 issues an erase command to auxiliary test circuit 150. In response, auxiliary test circuit 150 performs an erase operation, wherein each of the BIST circuits in auxiliary test circuit 150 causes the corresponding non-volatile memory devices to be erased. Thus, all of the non-volatile memory devices on test wafer 101 are erased in parallel. In the described embodiment, the time required to erase an entire 16 Mbit non-volatile memory device is about 1 second (including an internal verify operation). Because all of dies $11_1 11_N$ are erased in parallel, the time required to erase all of the non-volatile memory devices on test wafer 101 is about 1 second. Advantageously, there is a relatively small signal channel requirement between tester 104 and probe wafer 102 for an erase operation.

Read/Verify

The time required to perform a read/verify operation for each 16-Mbit non-volatile memory device on test wafer 101 is about 50–100 msec. In a conventional tester, a read/verify operation would be performed serially for each of the 600 dies on test wafer 101. As a result, the total time required to perform a read/verify operations on all 600 non-volatile memory devices on test wafer 101 would be about one minute. The read/verify operations are typically performed serially because of a limitation of the maximum number of interconnect lines that can be supplied and supported on test wafer 101.

An exemplary read/verify operation will now be described in accordance with one embodiment of the present invention. Tester 104 initially provides a read/verify command and a set of test data to auxiliary test circuit 150. The test data is initially loaded into a first set of registers in auxiliary test circuit 150, wherein each register corresponds with one of the dies $11_1$–$11_N$ on test wafer 101. The test data is then read from these registers in parallel, and then written to the non-volatile memory devices on dies $11_1$–$11_N$ in parallel in accordance with the above-described program operation.

The test data is then read from the non-volatile memory devices in parallel and stored in a second set of registers in auxiliary test circuit 150. The contents of the first set of registers are compared with the contents of the second set of registers. The results of this comparison are then evaluated to determine the results of the read/verify operation. The results of the comparison are evaluated by auxiliary test circuit 150 and/or tester 104. Advantageously, the read/verify test is performed largely in parallel, thereby saving significant test time. Also, probe wafer 102 results in a relatively small signal channel requirement between tester 104 and probe wafer 102 for a read/verify operation.

In the foregoing manner, auxiliary test circuit 150 enables test operations to be performed in a cost effective manner. In general, tester 104 provides a command to auxiliary test circuit 150 on silicon probe wafer 102. In response, probe wafer 102 initiates the tests specified by the command on all of dies $11_1$–$11_N$ (or a subset thereof) in parallel. Especially long tests and non-speed tests are likely to be performed well through auxiliary test circuit 150.

Note that during a normal test sequence, the above-described program, erase and read/verify operations are repeated several times, so that the total effect on wafer testing time and cost is large.

a. As described above, a main advantage of auxiliary test circuit 150 on probe wafer 102 is to alleviate the tester limitation on the total number of signal channels. However, if probe wafer 102 is insufficient to meet the requirements of high speed testing, tester 104 can bypass the auxiliary test circuit 150 on probe wafer 102 using the above-mentioned bypass switches on probe wafer 102, and execute the desired test program in a serial mode. Some amount of parallelism can still be retained in this serial mode, but for a smaller number of dies.

The test circuitry of the present invention can be implemented efficiently for industry use by using conventional CAD tools that automatically generate "test program circuits" in response to a test program or in response to a chip design.

In the above-described examples, the test circuitry is located on probe wafer 102 and in tester 104. In other embodiments, additional BIST circuitry is located on test wafer 101, adjacent to every tested die. This additional BIST circuitry is capable of testing each die in a relatively fast manner. This additional BIST circuitry is also capable of executing complicated testing programs for the non-volatile memory circuits, as well as DRAM circuits and other semiconductor integrated circuits. This BIST circuitry is described in more detail below.

BIST on Test Wafer 101

In accordance with another embodiment of the present invention, built-in self-test (BIST) circuitry is included on test wafer 101. As described above, each of dies $11_1$–$11_N$ on test wafer 101 includes a non-volatile memory device (although this is not necessary). Thus, dies $11_1$–$11_N$ may be referred to as non-volatile memory dies in the following description. The BIST circuitry on test wafer 101 in the described embodiment only uses 5–6 pins for each die, as opposed to more than 40 pins for a commodity non-volatile memory device, and more than 60 pins for an embedded non-volatile memory device. As a result, the width of the required signal channel between test wafer 101 and probe wafer 102 is greatly reduced when BIST circuitry is included on test wafer 101. In the described embodiment, the BIST circuitry shares pins that are used to access a commodity non-volatile memory device during normal operation of the device. Each of the BIST circuits on test wafer 101 is enabled (i.e., a BIST mode is entered) in response to a high voltage applied to one of the pins of the corresponding die, or in response to a signal generated by special logic. The BIST circuitry on test wafer 101 can be used in combination with wafer testing after chip scale packaging, although this is not necessary. Table 2 defines the functionality of pins of a non-volatile memory device in a BIST mode and a normal operation mode.

TABLE 2

| PIN | BIST Mode Signal | Normal Mode Signal |
| --- | --- | --- |
| 1 | GROUND | GROUND |
| 2 | $V_{cc}$ | $V_{cc}$ |
| 3 | DATA | DATA |
| 4 | RESET | CLOCK ENABLE |
| 5 | CLOCK | ADDRESS |

Because only five pins of each non-volatile memory device are required for testing, both probe card 102 and prober 103 can have a relatively simple design. In addition, the number of signal channels required in tester 104 will be significantly reduced (i.e., by a factor of seven) when compared with a conventional commodity non-volatile Memory device.

Furthermore, since almost all of the BIST activity is implemented on test wafer 101, the requirements of tester 104 are significantly lower than the requirements of a conventional tester for commodity non-volatile memory devices. In the present embodiment, tester 104 may consist of a simple board placed on top of prober 103, and connected to a personal computer (PC).

The BIST routine proceeds as follows. First, the relevant pins (e.g., pins 1–5) of each of non-volatile memory dies $11_1$–$11_N$ are connected to tester 104 through probe wafer 102 and prober 103 in the manner described above. Tester 104 then ramps up the voltage on pin 2 of each die to the specified value, thereby causing the corresponding non-volatile memory device to enter the BIST mode. Tester 104 then performs conventional open-circuit, short circuit and leakage tests for the connected pins 1–5. Tester 104 then provides the test clock signal (CLOCK) to pin 5 of each non-volatile memory die, and asserts the RESET signal on pin 4 of each non-volatile memory die. In response, the BIST circuitry on each of non-volatile memory dies $11_1$–$11_N$ initiates internal testing of these dies. The BIST circuitry on each of dies $11_1 11_N$ indicates when the internal testing is complete by asserting the RESET signal on pin 4 of the corresponding die. The BIST circuitry on each of dies $11_1 11_N$ then provides a data signal (DATA) indicating the results of the internal testing on pin 3 of the corresponding die. This data identifies: whether the non-volatile memory passed or failed the test, the failure bin number if the non-volatile memory failed the test, and the location and type of failure if the non-volatile memory failed the test. In the described embodiment, the test results are stored by tester 104. In another embodiment, the test results for each non-volatile memory device are stored on the corresponding die. Tester 104 waits until the internal testing is completed for all of the non-volatile memory dies $11_1$–$11_N$ on test wafer 101 before initiating another test. Testing will be completed at about the same time for dies that pass the testing. Failing dies will finish the testing sooner (i.e., at the time of failure).

To enable the BIST circuitry to run more than one test program, different test programs can be identified by different sequences of signals on pins 3-5. For example, instead of initiating a single test program asserting the RESET signal on pin 4, a first test program may be initiated by asserting the RESET signal on pin 4, and then asserting the DATA signal on pin 3. A second test program may be initiated by asserting the RESET signal on pin 4, and then de-asserting the DATA signal on pin 3.

In accordance with another embodiment of the present invention, the BIST circuitry is located in scribe-line areas on test wafer 101. The scribe-line areas are located between dies $11_1$–$11_N$, and provide adequate space for the dies to be sawn apart without damaging the circuitry fabricated on the dies. Because the scribe-line areas typically have a width of 150 microns, the BIST circuitry is limited to a width of about 150 microns in this embodiment. Note that the BIST circuitry is used while test wafer 101 is intact, and then destroyed during the die separation process, after testing has been completed. Advantageously, little to none of the area of test wafer 101 is wasted in this embodiment.

One variation of this embodiment is to replace the distributed BIST circuitry with one or more relatively large BIST circuits fabricated on drop-ins areas of test wafer 101. Drop-in areas are defined as areas of test wafer 101 that do not include dies, and are typically used for structures such as test chips. Routing circuits, such as interconnect lines and multiplexers, are provided on test wafer 101 in order to sequentially connect groups of dies $11_1$–$11_N$ to the large BIST circuits. In a particular embodiment, the ratio of dies to BIST circuits is on the order of 100:1 to 1000:1.

Complete Testing of Test Wafer 101

The above described test routine will not typically satisfy all of the testing requirements of a commodity non-volatile memory (or other semiconductor device). For example, many pins have not been tested, and the device has not been tested for speed. The complete test flow for a commodity non-volatile memory will therefore proceed as follows.

Initially, processing of a wafer lot is completed in a fab. The wafer lot then goes through production control monitor (PCM) testing, and failing wafers are scrapped. The passing test wafers can then optionally be subjected to wafer level chip scale packaging (WLCSP), such that the parallel testing described above can be implemented. The test wafers are then subjected to a first test in accordance with the above-described procedures. At the end of this first test, the test wafers are fully programmed with a predetermined test pattern, typically all logic "0" values. The test wafers are then baked to accelerate charge loss (if present). The baking step is typically performed at 250–275° C. for 24 hours. After baking, the test wafers are subjected to a second test in accordance with the above-described procedures. During this second test, the contents of the non-volatile memory devices on the test wafers are read and compared with the predetermined test pattern, thereby testing the retention of the non-volatile memory devices. An erase operation is then performed on the test wafers.

The test wafers are then subjected to a third test on a conventional tester. During the third test, all of the parameters that were not tested during the first and second tests, such as speed and leakage, are tested. In addition, pins that were not tested during the first and second tests are tested during the third test. The conventional tester can only connect to a relatively small number of pins. For example, a conventional tester may be able to connect to 768 pins, which is equal to 48 pins for 16 parallel dies. As described above, there are approximately 600 non-volatile memory dies on a typical 6-inch wafer. In accordance with the invention, there are only about 3000 pins (600×5) for the same 6-inch wafer when the above-described distributed BIST circuitry is used. Thus, a conventional tester having 768 pins is capable of testing 153 (768/5) non-volatile memory dies in parallel. Thus, the third test of the test wafer can be completed in a relatively short time period when using the distributed BIST circuitry of the present invention. Moreover, the third test can be completed in a relatively short time period because the non-volatile memory devices do not need to be programmed and erased during the third test. Note that the second and third tests can be combined and performed on a conventional tester, provided that the erase operation performed during the second test is not too lengthy. The decision to combine the second and third tests can be made for each individual case based on the specific parameters involved. In an alternate embodiment, the first test can be performed using a conventional tester.

In some cases, the non-volatile memory dies on the test wafers is subjected to a step of cycling where the memory is programmed and erased many (10–1000) times before shipping to "kill" all of the weak dies and reduce infant mortality levels with the customer. This is a similar philosophy to production burn-in. The above-described distributed BIST circuitry can advantageously perform this memory cycling using a very simple tester. In this test, it is not necessary to output failure data from the dies in until after the memory cycling is completed.

Although the invention has been described in connection with several embodiments, it is understood that this invention is not limited to the embodiments disclosed, but is capable of various modifications, which would be apparent to a person skilled in the art. Thus, the invention is limited only by the following claims.

I claim:
1. A test system comprising:
    a test wafer having a plurality of dies to be tested and a first set of pads exposed in a first pattern at a first surface of the test wafer, the first set of pads providing electrical connections to the dies;
    a probe wafer having an auxiliary test circuit fabricated thereon, a second set of pads exposed in a second pattern at a first surface of the probe wafer, a third set of pads exposed in a third pattern at a second surface of the probe wafer, and an interconnect structure for connecting the auxiliary test circuit, the second set of pads and the third set of pads;
    a prober configured to align the first set of pads of the test wafer with the second set of pads of the probe wafer, place the first set of pads of the test wafer into contact with the second set of pads of the probe wafer.

2. The test system of claim 1, wherein the prober further comprises a set of probe needles configured to contact the third set of pads at the second surface of the probe wafer.

3. The test system of claim 2, further comprising a tester, wherein the prober includes means for coupling the tester to the probe needles.

4. The test system of claim 1, wherein each of the dies includes a non-volatile memory array.

5. The test system of claim 1, wherein the auxiliary test circuit includes a plurality of test circuits, each being coupled to a corresponding die on the test wafer.

6. The test system of claim 1, wherein the test wafer further comprises a plurality of built-in self-test (BIST) circuits, which are coupled to the auxiliary test circuit in probe wafer.

7. The test system of claim 6, wherein each of the dies has a corresponding BIST circuit.

8. The test system of claim 6, wherein the ratio of the dies to the BIST circuits is 100:1 to 1000:1.

9. The test system of claim 6, wherein the BIST circuits are located in scribe-line areas or drop-in areas of the test wafer.

10. The test system of claim 1, wherein the probe wafer further comprises a plurality of electrically conductive studs located on the second set of pads, wherein the conductive studs contact the first set of pads on the test wafer when the probe wafer is coupled to the test wafer.

11. The test system of claim 1, wherein the interconnect structure of the probe wafer extends around edges of the probe wafer.

12. The test system of claim 1, wherein the interconnect structure of the probe wafer extends through the probe wafer, between the first surface of the probe wafer and the second surface of the probe wafer.

13. The test system of claim 1, wherein the auxiliary test circuit comprises circuitry for performing a read/verify operation in the test wafer.

14. The test system of claim 1, wherein the auxiliary test circuit comprises circuitry for performing a program operation in the test wafer.

15. The test system of claim 1, wherein the auxiliary test circuit comprises circuitry for performing an erase operation in the test wafer.

16. The test system of claim 1, wherein the probe wafer comprises a monocrystalline semiconductor material.

17. The test system of claim 1, wherein the prober further comprises means for aligning the probe wafer and the test wafer.

18. The test system of claim 17, wherein the means for aligning comprise a mechanical alignment system.

19. The test system of claim 18, further comprising alignment holes formed through the probe wafer.

20. The test system of claim 18, wherein the test wafer and the probe wafer have the same size and shape.

21. The test system of claim 17, wherein the means for aligning comprise an optical alignment system.

22. The test system of claim 21, further comprising optical alignment marks on the test wafer and the probe wafer.

23. The test system of claim 1, wherein the test wafer is a wafer level chip scale packaged (WLCSP) wafer.

24. A method for testing a plurality of dies located on a test wafer, the method comprising:
    coupling the test wafer to a probe wafer, such that a set of pads on the test wafer is placed into contact with a first set of pads on a first surface of the probe wafer;
    coupling a prober to a second set of pads on a second surface of the probe wafer, opposite the first surface;
    transmitting a first set of test signals from the prober to the second set of pads of the probe wafer;
    transmitting the first set of test signals from the second set of pads to test circuitry fabricated on the probe wafer;
    generating a second set of test signals in response to the first set of test signals using the test circuitry; and
    transmitting the second set of test signals from the test circuitry on the probe wafer to the test wafer through the first set of pads on the probe wafer and the set of pads on the test wafer.

25. The method of claim 24, further comprising:
    generating a third set of test signals in response to the second set of test signals using the dies on the test wafer; and
    transmitting the third set of test signals to the test circuitry on the probe wafer.

26. The method of claim 25, wherein the third set of test signals are further generated using built-in self-test (BIST) circuits located on the test wafer.

27. The method of claim 24, wherein the step of coupling the test wafer to the probe wafer further comprises optically aligning the test wafer and the probe wafer.

28. The method of claim 24, wherein the step of coupling the test wafer to the probe wafer further comprises mechanically aligning the test wafer and the probe wafer.

29. A probe wafer comprising:
    a substrate;
    test circuitry fabricated on the substrate;
    an interconnect circuit coupled to the test circuitry;
    a first set of pads coupled to the interconnect circuit at a first surface of the substrate, the first set of pads having a pattern to correspond with a pattern of pads on a test wafer;
    a second set of pads located on a second surface of the substrate, wherein the second surface is opposite the first surface; and
    a plurality of traces coupling the first set of pads to the second set of pads.

30. The probe wafer of claim 29, wherein a first set of the traces extend around outer edges of the substrate.

31. The probe wafer of claim 30, wherein a second set of traces extend through the substrate.

32. The probe wafer of claim 29, wherein a set of the traces extend through the substrate.

33. The probe wafer of claim 29, wherein the test circuitry comprises a first set of registers for storing a first set of test data values to be written to a test wafer.

34. The probe wafer of claim 33, wherein the test circuitry further comprises a second set of registers for storing a second set of test data values read from the test wafer.

35. The probe wafer of claim 34, wherein the test circuitry further comprises a set of comparators for comparing the first set of test data values with the second set of test data values.

36. The probe wafer of claim 29, wherein the test circuitry comprises circuitry for performing a read/verify operation in the test wafer.

37. The probe wafer of claim 29, wherein the test circuitry comprises circuitry for performing a program operation in the test wafer.

38. The probe wafer of claim 29, wherein the test circuitry comprises circuitry for performing an erase operation in the test wafer.

39. The probe wafer of claim 29, wherein the substrate comprises a monocrystalline semiconductor material.

40. The probe wafer of claim 39, wherein the substrate comprises silicon.

41. The probe wafer of claim 29, wherein the substrate comprises a ceramic or glass material.

42. The probe wafer of claim 29, further comprising a plurality of electrically conductive studs formed on the first set of pads.

43. The probe wafer of claim 29, wherein the test circuitry includes a plurality of test circuits, wherein each test circuit corresponds with a die in the test wafer.

\* \* \* \* \*